United States Patent [19]

LaMacchia

[11] Patent Number: 4,623,846
[45] Date of Patent: Nov. 18, 1986

[54] CONSTANT DUTY CYCLE, FREQUENCY PROGRAMMABLE CLOCK GENERATOR

[75] Inventor: Michael P. LaMacchia, Chandler, Ariz.

[73] Assignee: Motorola, Inc., Schaumburg, Ill.

[21] Appl. No.: 701,727

[22] Filed: Feb. 14, 1985

[51] Int. Cl.$^4$ ............................................. H03K 3/01
[52] U.S. Cl. .................................... 328/61; 307/265
[58] Field of Search ..................... 328/61; 377/47, 52, 377/107, 110, 39; 307/265

[56] References Cited

U.S. PATENT DOCUMENTS

| | | | |
|---|---|---|---|
| 3,683,159 | 8/1972 | Welch et al. | 377/47 |
| 3,805,167 | 4/1974 | Nash et al. | 307/265 |
| 4,019,029 | 4/1977 | Pozzetti | 377/52 |
| 4,352,995 | 10/1982 | Yoshida et al. | 328/61 |
| 4,355,283 | 10/1982 | Ott | 307/255 |

Primary Examiner—John S. Heyman
Assistant Examiner—Karl Ohralik
Attorney, Agent, or Firm—Lowell W. Gresham

[57] ABSTRACT

A digital clock generator circuit which accepts a rate signal and a master clock signal and generates an output clock signal exhibiting a frequency which is programmed by the rate signal is disclosed. A constant duty cycle characteristic of the output clock signal is obtained regardless of the output clock signal's frequency. A memory element which generates the output signal is placed in one logical state when a counter portion of the present invention reaches a terminal count. The memory element is placed in an opposing logical state whenever the counter achieves ½ of its programmed value. A duty cycle compensator makes small timing adjustments to compensate for any truncation error which occurs in dividing the rate signal by two.

15 Claims, 4 Drawing Figures

4,623,846

CONSTANT DUTY CYCLE, FREQUENCY PROGRAMMABLE CLOCK GENERATOR

BACKGROUND OF THE INVENTION

This invention relates to a digital electronic circuit which generates a clock signal. More specifically, the present invention relates to a clock generator in which the frequency of the output clock signal is externally programmable. Further, the present invention relates to a frequency programmable clock generator in which the duty cycle of the output clock signal remains constant regardless of the clock signal's frequency.

Many frequency and clock synthesis circuits require a clock signal which varies in accordance with an externally applied rate signal. Many applications additionally require a predetermined, constant duty cycle. For example, many applications prefer a fifty percent duty cycle clock signal because the conversion of the clock signal into a sine wave then requires a minimum amount of filtering. However, the generation of a clock signal which varies in frequency yet exhibits a known, constant duty cycle requires special circuitry.

One prior art circuit which generates a frequency programmable, constant duty cycle clock signal uses a counter and a master clock signal. The master clock signal is doubled in frequency and the doubled frequency clock signal is applied to the counter. The counter may be loaded with different values to achieve the frequency programmability. An output from the counter is then divided by 2 to provide an output clock signal which exhibits a constant duty cycle.

However, this and other similar prior art circuits will not work in certain high frequency applications where the master clock signal, without doubling, oscillates at a frequency which approaches the upper frequency limits of the counter. In this situation, a doubling of the master clock signal produces a signal which is too fast for proper operation of the counter.

SUMMARY OF THE INVENTION

Accordingly, it is an object of the present invention to provide an improved clock generator circuit which is frequency programmable and provides an output clock signal which exhibits a constant duty cycle.

Another object of the present invention concerns providing an improved clock generator circuit which refrains from doubling a master clock signal.

The above and other objects and advantages of the present invention are carried out in one form by a circuit which contains a counter, a count decoder, a duty cycle compensator, and a memory element. The counter has one input which responds to a master clock signal and another input which responds to a rate signal. The rate signal is a digital signal which includes a least significant bit and a most significant bit. The count decoder has one input which couples to an output of the counter, and another input which responds to the most significant bit of the rate signal. The duty cycle compensator has one input which responds to the least significant bit of the rate signal and another input which responds to the master clock signal. The memory element has an input which couples to an output of the count decoder and an output of the duty compensator.

BRIEF DESCRIPTION OF THE DRAWINGS

A more complete understanding of the present invention may be derived by reference to the detailed description and claims when considered in connection with the accompanying drawings, wherein:

DETAILED DESCRIPTION OF THE PREFERRED EMBODIMENTS

Figure 1:
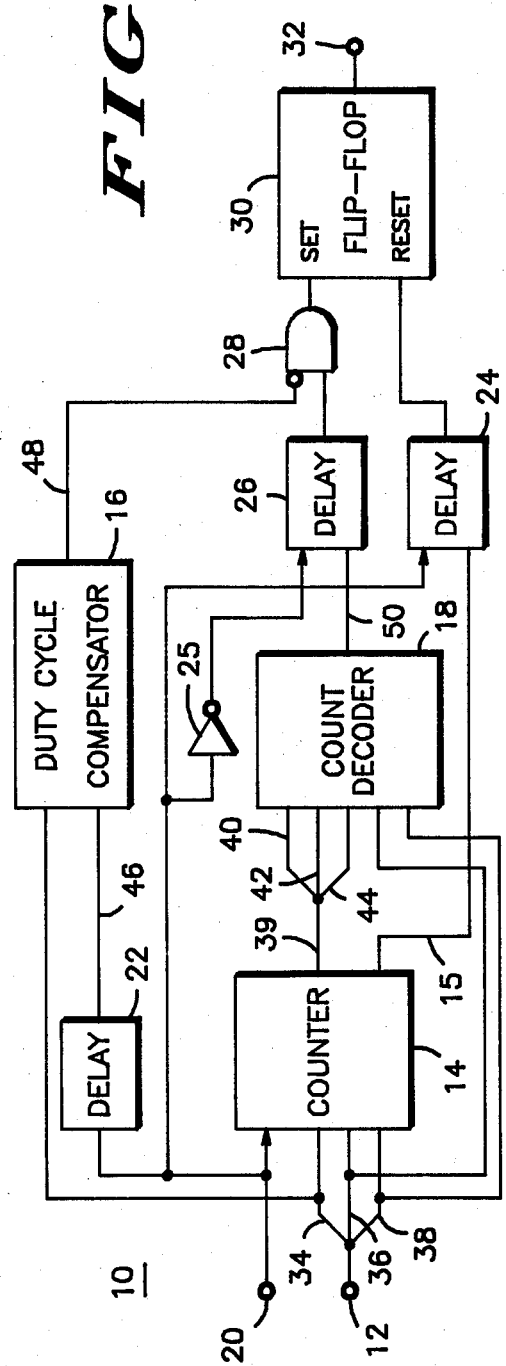
FIG. 1 shows a block diagram of the present invention.

In a block diagram of the present invention shown in FIG. 1, a clock generator 10 contains an input terminal 20 which is adapted to receive a master clock signal. Terminal 20 connects to a clock input of a counter 14, a clock input of a delay element 24, an input of an inverter 25, and an input of a delay element 22. An output of inverter 25 connects to a clock input of a delay element 26.

An input 12 receives a rate signal and is connected to a data input of counter 14. The rate signal may contain a plurality of bits of information. Accordingly, a single least significant bit (LSB) of the rate signal connects to counter 14 and to a duty cycle compensator 16 at a node 34. Medium significant bits connect to counter 14 and to a count decoder 18 at nodes 36, and a single most significant bit (MSB) connects to counter 14 and to count decoder 18 at a node 38.

Counter 14 provides a count signal at a count output 39 and a terminal count signal at terminal count indicator 15. The count output signal also contains a plurality of bits of information. Thus, a single least significant bit of the count signal connects to count decoder 18 at a node 40, medium significant bits of the count signal connect to count decoder 18 at nodes 42, and a single most significant bit connects to count decoder 18 at a node 44. Terminal count indicator 15 connects to an input of delay element 24.

Count decoder 18 provides an output at node 50 which connects to an input of delay element 26. An output of delay element 26 and an output of duty cycle compensator 16 connect to separate inputs of an AND element 28. An ouptut delay element 22 connects to an input of duty cycle compensator 16 at node 46.

A memory element 30, such as a flip-flop, provides the output signal for clock generator 10. An output of memory element 30 connects to a terminal 32. Memory element 30 additionally contains a set input and a reset input. The set input connects to an output of AND element 28 and the reset input of memory element 30 connects to an output of delay element 24.

In the present invention, counter 14 may be a conventional synchronous counter operating in either a count-up or a count-down mode. The maximum value to which or from which the counter can count, is not important in the scope of the present invention. The counter loads a digital value, which in the present invention is represented by the rate signal, at the counter data input. The counter counts master clock pulses producing the count signal which increments or decrements between this digital value and an extreme value of all ones or all zeros. A terminal value occurs when bits of the count signal exhibit a predetermined logical state, such as all ones, all zeros, or the value loaded at the counter's data input. The counter outputs a pulse on the terminal count indicator to signal that a terminal count has been reached. The counter then repeats the count cycle between the extreme value and the loaded digital data input value. Those skilled in the art recognize that many types of conventional counters will suffice in this invention, and that each of the differnet types of counters may have implementation particularities which can be accounted for using conventional design techniques.

Count decoder 18 inputs the counter signal and a portion of the rate signal. Count decoder 18 produces a signal at its output indicating that the count output signal equals a predetermined portion of the value presented in the rate signal. This predetermined portion of the rate signal value directly corresponds to the duty cycle of the output signal at terminal 32. In an embodiment of the present invention which generates a fifty percent duty cycle output clock signal at terminal 32, count decoder 18 produces a pulse at the count decoder output whenever it detects a count signal which equals one-half of the value represented in the rate signal.

Figure 2:
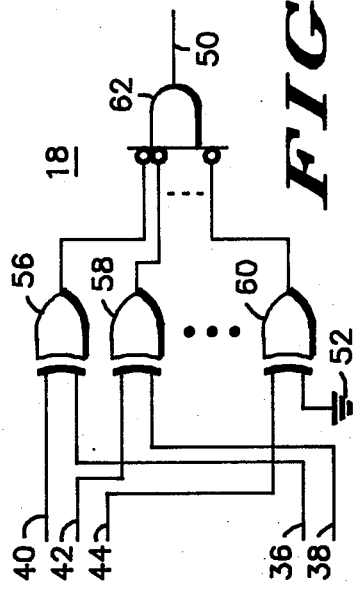
FIG. 2 shows a circuit schematic for one embodiment of a count decoder portion of the present invention.

FIG. 2 shows a schematic diagram of a particular embodiment of count decoder 18 which is useful in generating a fifty percent duty cycle clock signal at terminal 32 (See FIG. 1) using a three-bit counter. Count decoder 18 performs two functions. A first function is the division of the rate signal by a factor of two. A second function is the detection of a count signal value equaling the divided-by-two rate signal value.

As shown in FIG. 2, the least significant bit of counter output 39 connects to a first input of a least significant Exclusive-OR element 56 at node 40. Node 42, which carries a medium significant bit from counter output 39 connects to a first input of a medium significant Exclusive-OR element 58. And, node 44, which carries the most significant bit of counter output 39, connects to a first input of a most significant Exclusive-OR element 60. A predetermined static logic level, such as a ground 52, connects to a second input of most significant Exclusive-OR element 60. Node 38, which carries the most significant bit of the rate signal, connects to a second input of the medium significant Exclusive-OR element 58. Likewise, node 36, which contains a medium significant bit from the rate signal connects to a second input of least significant Exclusive-OR element 56. Each of Exclusive-OR elements 56, 58 and 60 have outputs which connect to unique inputs of an AND element 62. AND element 62 has an output which connects to node 50.

An active signal is generated at node 50 whenever the least significant bit from the count signal equals the medium significant bit from the rate signal, the medium significant bit from the count signal equals the most significant bit from the rate signal, and the most significant bit from the count signal equals a predetermined static logic level, such as ground 52. The division function of count decoder 18 occurs from shifting the rate signal one bit toward the least significant bit relative to the count signal in the connections to count decoder 18. The decoding function occurs through the use of Exclusive-OR elements and an AND element.

As used herein, the output of an Exclusive-OR element exhibits one logical state when its inputs are in the same logical state, and exhibits another logical state when its inputs are in different logical states. Either Exclusive-OR gates, Exclusive-NOR gates, or combinations of other gates may be utilized to achieve an Exclusive-OR element. Likewise, an AND element exhibits an active level when all its inputs are at active levels. Either AND, NAND, OR, NOR, or combinations of gates may be utilized to achieve an AND element. FIG. 2 also assumes that counter 14 operates in a count-up mode from an extreme count of all zeros on the count signal. Thus, the predetermined static logic level is represented by ground 52. Those skilled in the art will recognize that other types of counters or other counting conventions may require the predetermined static logic level to be connected to a logical one. Finally, the FIG. 2 count decoder may be modified to accommodate additional medium significant bits by adding additional Exclusive-OR elements and inputs to AND element 62 in a manner similar to that described above.

Duty cycle compensator 16 (see FIG. 1) operates as a fine adjustment circuit in producing a clock signal which exhibits a constant duty cycle. As discussed above, a division of the rate signal occurs in count decoder 18. For a fifty percent duty cycle clock output signal, the rate signal is divided by two. This division produces a truncation error which, without duty cycle compensator 16, would result in the output signal at terminal 32 exhibiting an imprecise duty cycle. This truncation error occurs because the rate signal is shifted toward its least significant bit. Thus, information contained in the least significant bit is not presented to count decoder 18, and fails to be considered in the decoding performed by count decoder 18. Acordingly, duty cycle compensator 16 uses information contained in the least significant bit of the rate signal to modify the timing of the signal produced by count decoder 18 and AND element 28.

Figure 3:
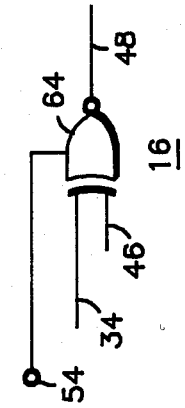
FIG. 3 shows a circuit schematic for one embodiment of a duty cycle compensator portion of the present invention.

FIG. 3 shows one specific embodiment of duty cycle compensator 16. In FIG. 3, node 34, which carries the least significant bit from the rate signal, connects to a first input of an Exclusive-OR element 64. Node 46 connects to a second input of Exclusive-OR element 64. Node 46 contains the master clock signal delayed through delay element 22. An output from Exclusive-OR element 64 connects to node 48. And, a threshold adjustment input to Exclusive-OR element 64 connects to a terminal 54. Exclusive-OR element 64 is represented as an Exclusive-NOR gate, which is one particlar embodiment of an Exclusive-OR element, so that the signal polarity conventions are consistent between FIGS. 1, 2 and 3.

Generally speaking, the master clock signal is selectively inverted through duty cycle compensator 16 depending upon the logical state of the least significant bit from the rate signal. When this selectively inverted master clock signal is presented to node 48, it has the effect of selectively disabling AND element 28 for approximately $\frac{1}{2}$ of a master clock signal cycle after the clocking of delay element 26 by an inverted master clock signal. This in turn has the effect of delaying the count decoder output signal to memory element 30 by approximately $\frac{1}{2}$ of a clock pulse.

Delay elements 24 and 26 may contain both a synchronous portion of delay, such as may be obtained through the use of flip-flops, and an asynchronous portion of delay which may be obtained through coaxial cable, logical gates placed in series with the signals being delayed, delay lines, and other techniques known to those skilled in the art. Delay element 22 contains only an asynchronous delay element. The synchronous elements of delay are used to remove transient logical states which may appear in the outputs from count decoder 18 and the terminal count indicator of counter 14 and adjust timing between the terminal count signal and the count decoder output signal.

The asynchronous elements of delay are included so that precise adjustments in duty cycle may be achieved and transient states caused by propagation delays may be avoided. Accordingly, in the present embodiment the instant in time when delay element 24 resets memory element 30 may be delayed by the asynchronous delay portion of delay element 24. The setting of memory element 30 results from a signal output either from delay element 26 or duty cycle compensator 16, depending on the logical state of the rate signal's least significant bit, as discussed above. Thus, the asynchronous portion of delay associated with delay element 26 and the delay associated with delay element 22 operate to delay the instant in time when memory element 30 becomes set. These asynchronous delays may be adjusted in a conventional manner so that the setting of memory element 30 is delayed more than the resetting, or vice-versa, to achieve a precise desired duty cycle.

The threshold adjustment input of Exclusive-OR element 64, shown in FIG. 3, provides another opportunity to adjust the output duty cycle. An analog signal may be applied to terminal 54 to modify the switching threshold of Exclusive-OR element 64. By modifying this switching threshold, a propagation delay associated with Exclusive-OR element 64 may be adjusted.

In summary, the output from clock generator circuit 10 is forced into one logical state by the terminal count signal output from counter 14, delayed through delay element 24, resetting flip-flop 30. A second logical state occurs when flip-flop 30 is set by a signal generated by count decoder 18 and delayed through delay element 26. The count decoder 18 signal may be further delayed through AND gate 28 being selectively disabled depending upon the logical state of the least significant bit of the rate signal.

Figure 4:
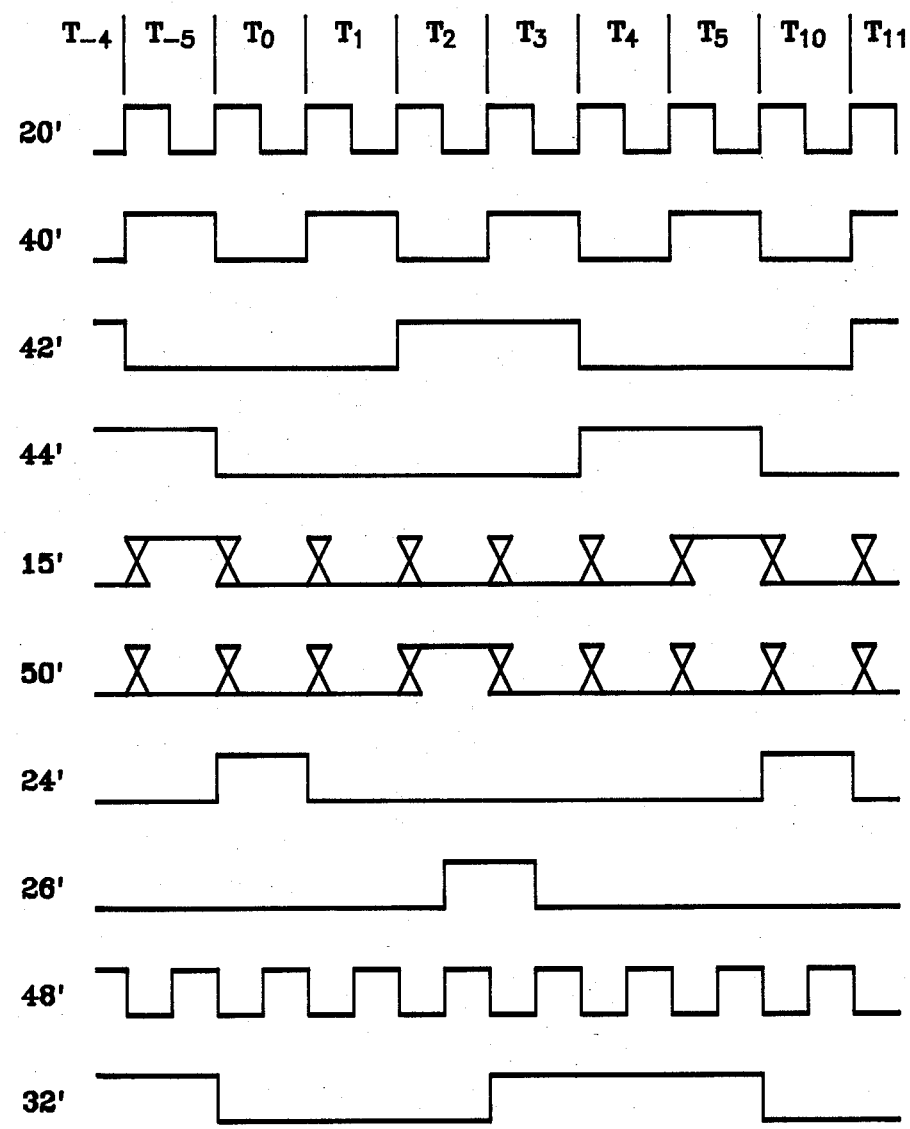
FIG. 4 shows a timing diagram for a three bit counter embodiment of the present invention.

In order to aid understanding of the present invention, a timing diagram of a 3-bit counter embodiment of the present invention is presented in FIG. 4. In this embodiment counter 14 (see FIG. 1) is a 3 bit, synchronous, count-up counter. Counter 14 exhibits a terminal count, or reset signal, whenever the counter output signal equals a value presented to counter 14 in the rate signal. The FIG. 4 embodiment assumes for the purposes of explanation that a value of five is presented to counter 14 by the rate signal. Of course those skilled in the art will recognize that this particular type of counter, this rate signal value, various signal level polarity conventions and absolute values of synchronous delays presented in FIG. 4 are merely for the purpose of explaining the present invention and are not important to its implementation. Additionally, asynchronous delays are de-emphasized so that the logical relationships between the various signals may be highlighted.

Trace 20' in FIG. 4 shows an example of the master clock signal. The count signal is shown in traces 40', 42', and 44', where trace 40' represents the least significant bit of the count signal, trace 42' represents the medium significant bit, and trace 44' represents the most significant bit. Trace 15' represents a signal output at terminal count indicator 15, or the reset output, from counter 14.

The timing diagram shown in FIG. 4 is divided into several time periods. In a time period $T_{-5}$, the output from counter 14 exhibits a value of five. Since the value five is the value loaded into counter 14 by the rate signal, it represents the maximum value to which counter 14 counts. Thus, in time period $T_{-5}$ the terminal output signal 15' is in a logical 1 state, indicating that the counter should reset in the next time period. Accordingly, time period $T_0$ shows the output signal from counter 14 in a zero state, or having 000 logic levels at nodes 44, 42, and 40, respectively. Counter 14 then increments the value presented in the count signal in time periods $T_1$ through $T_5$. At time period $T_5$ the value presented by the rate signal is again exhibited in the count signal. This process repeats starting in time period $T_5$ when a binary 101 logic level appears at nodes 44, 42, and 40 respectively.

As described above, count decoder 18 divides the value presented by the rate signal by two and generates an active output signal when the counter output exhibits a value equal to this divided rate signal. In this specific example, a value of five is presented in the rate signal and a division by two provides a quotient of two. Thus, count decoder 18 generates a pulse during time period $T_2$ indicating that the output value from counter 14 equals two, or exhibits 010 logic levels on nodes 44, 42, and 40 respectively. As discussed above, a truncation error has occurred in the division of the rate signal which is compensated for by duty cycle compensator 16.

Both terminal count indicator signal 15' and count decoder output signal 50' may exhibit transient states immediately after the counter changes to a new time period. These transient states are indicated as X's in traces 15' and 50'. During the transient states the outputs of these two signals may be in either a logical 1 or a logical 0 state.

Trace 24' represents the output signal from delay element 24. The signal output from delay element 24 represents the signal output from terminal count indicator 15 of counter 14 synchronously delayed in time by one time period. Additionally, the signal output from delay element 24 does not contain the transient states which are present in terminal count indicator signal 15' because delay element 24 samples the terminal count indicator signal after all transient states have died out.

Delay element 26 produces an output signal which is shown in trace 26'. Delay element 26 synchronously delays the signal output from count decoder 18 by an amount equivalent to approximately ½ of a time period as shown in trace 26'. Additionally, the transient states which are present in count decoder output signal 50' are removed from delay element signal 26'.

Delay element signal 24' resets memory element 30 to a logical 0 level as is shown in trace 32'. In order to achieve a fifty percent duty cycle, delay element signal 26' must be delayed by approximately ½ of a time period before being allowed to set memory element 30. Accordingly, duty cycle compensator 16 generates a signal which is approximately the inverse of master clock signal 20'. The inversion of master clock signal 20' within duty cycle compensator 16 occurs because the least significant bit of the rate signal is at a logical 1 level in this example where a value of five is assumed to be applied in the rate signal. Accordingly, duty cycle compensator output signal 48' disables AND element 28 during the last half of period $T_2$, thereby prohibiting delay element signal 26' from setting memory element 30. However, during the first half of time period $T_3$ AND element 28 becomes enabled by duty cycle compensator signal 48', and delay element signal 26' is allowed to set memory element 30 to a logical 1 state.

The above described process then repeats starting at time period $T_{10}$ when delay element signal 24' again becomes active. As a result, a clock signal is generated by clock generator 10 which has a frequency corresponding to six pulses of the master clock signal. This frequency is programmed into clock generator 10 by the rate signal containing a value of five and the counter counting between count output states zero and five, inclusively. Additionally, a fifty percent duty cycle is achieved because memory element 30 is reset at the beginning of this six-time-period cycle and set in the middle of the cycle.

The duty cycle of clock signal 32' remains constant regardless of a particlar value programmed into counter 14 by the rate signal. For example, if a value of four is programmed into counter 14 by the rate signal rather than a value of five as shown in FIG. 4, delay element signal 24' still becomes active during time period $T_0$ and clock signal 32' still becomes reset at the beginning of time period $T_0$. However, compensation signal 48' approximately follows master clock signal 20' because the least significant bit of a rate signal value of four is now a 0. Accordingly, AND element 28 becomes enabled during the last half of time period $T_2$ and delay element signal 26' is permitted to set memory element 30 during the middle of time period $T_2$, rather than at the beginning of time period $T_3$ as shown in FIG. 4. Resultingly, a fifty percent duty cycle is maintained regardless of a particular value presented by the rate signal.

The foregoing description uses preferred embodiments to illustrate the present invention. However, those skilled in the art will recognize that changes and modifications may be made in this embodiment without departing from the scope of the present invention. For example, a second counter clocked by the master clock signal may suffice for count decoder 18. In this case, the rate signal would be shifted one bit towards the least significant bit before being input to the data input of this second counter. Additionally, combinations of gates may be used to accomplish any of the Exclusive-OR elements or AND elements described herein. Such combinations of gates may produce different delays, but these delays could be compensated for by the synchronous and asynchronous portions of delay elements 22, 26, and 24. These and other modifications obvious to those skilled in the art are intended to be included within the scope of this invention.

What is claimed is:

1. A clock generator circuit for generating a variable frequency clock signal having two logical states and a constant, predetermined duty cycle, said generator circuit comprising:
    a counter having a count output and a terminal count indicator, said counter being responsive to a master clock signal and a rate signal, the rate signal having a least significant bit and a most significant bit;
    a count decoder having a first input coupled to the count output of said counter, a second input being responsive to the most significant bit of the rate signal, and having an output;
    a duty cycle compensator having a first input responsive to the least significant bit of the rate signal, having a second input responsive to the master clock signal, and having an output; and
    a memory element having a first input coupled to the output of said count decoder and the output of said duty cycle compensator and an output for providing the variable frequency clock signal, said memory element being configured so that the variable frequency clock signal changes between the two logical states in accordance with the predetermined duty cycle.

2. A clock generator circuit as claimed in claim 1 wherein said memory element additionally has a second input coupled to the terminal count indicator of said counter.

3. A clock generator circuit as claimed in claim 2 wherein said memory element comprises a flip-flop, the first input of said memory element is one of a set input and a reset input of said flip-flop, and the second input of said memory element is the other of the set and reset inputs of said flip-flop.

4. A clock generator circuit as claimed in claim 2 additionally comprising a delay element coupled between the terminal count indicator of said counter and the second input of said memory element.

5. A clock generator circuit as claimed in claim 1 additionally comprising a delay element coupled between said memory element and said count decoder.

6. A clock generator circuit as claimed in claim 1 additionally comprising a delay element coupled to the second input of said duty cycle compensator so that the master clock signal drives the second input of said duty cycle compensator through said delay element.

7. A clock generator circuit as claimed in claim 1 wherein:
    the rate signal additionally comprises at least one medium significant bit; and
    said count decoder additionally has a medium significant input, the medium significant input being responsive to all medium significant bits of the rate signal.

8. A clock generator circuit as claimed in claim 7 wherein the count output of said counter contains a least significant bit and a most significant bit and said count decoder comprises:
    a least significant Exclusive-OR element having a first input coupled to the least significant bit of the count output, having a second input being responsive to one of the rate signal medium significant bits, and having an output;
    a most significant Exclusive-OR element having a first input coupled to the most significant bit of the count output, having a second input coupled to a predetermined static logic level, and having an output; and
    an AND element having a first input coupled to the output of said least significant element, having a second input coupled to the output of said most significant element and having an output serving as the output of said count decoder.

9. A clock generator circuit as claimed in claim 1 wherein said duty cycle compensator comprises an Exclusive-OR element having a first input being responsive to the least significant bit of the rate signal, having a second input being responsive to the master clock signal, and having a output serving as the output of said duty cycle compensator.

10. A clock generator circuit as claimed in claim 9 wherein said Exclusive-OR element additionally comprises a third input for adjusting a switching threshold of said element.

11. A method of generating a variable frequency clock signal having an approximately fifty perent duty cycle, said method comprising the steps of:

counting master clock pulses between a value presented by a rate signal and an extreme value;

dividing the value presented by the rate signal by two and providing a result of said dividing step;

decoding the occurence in said counting step of a count equal to the result provided by said dividing step;

compensating for a truncation error occuring in said dividing step;

causing a memory element to exhibit a first logical state upon the occurence in said counting step of a terminal count value; and causing the memory element to exhibit a second logical state upon the completion of said decoding and compensating steps.

12. A method of generating a clock signal as claimed in claim 11 additionally comprising the step of delaying said causing a memory element to exhibit a first logical state step by a predetermined period of time to remove transient counter states.

13. A method of generating a clock signal as claimed in claim 12 additionally comprising the step of delaying said causing the memory element to exhibit a second logical state by a predetermined period of time to remove transient counter states.

14. A method of generating a clock signal as claimed in claim 11 additionally comprising the step of adjusting a threshold in said compensating step to improve duty cycle precision.

15. A clock generator circuit comprising:

a counter having a terminal count indicator and a count output, the count output containing a least significant bit and a most significant bit, said counter being responsive to a master clock signal and a rate signal, the rate signal having a least significant bit, at least one medium significant bit, and a most significant bit;

a least significant Exclusive-OR element having a first input coupled to the least significant bit of the count output, a second input being responsive to one of the rate signal medium significant bits, and an output;

a most significant Exclusive-OR element having a first input coupled to the most significant bit of the count output, a second input coupled to a predetermined static logic level, and an output;

an AND element having a first input coupled to the output of said least significant element, a second input coupled to the output of said most significant element, and having an output;

a compensation Exclusive-OR element having a first input being responsive to the least significant bit of the rate signal, a second input being responsive to the master clock signal, a third input for adjusting a switching threshold of said compensation Exclusive-OR element, and an output; and a flip-flop having a set input and a reset input wherein the terminal count indicator of said counter couples to one of the set and reset inputs, and the outputs from said AND and compensation Exclusive-OR elements couple to the other of the set and reset inputs.

* * * * *